United States Patent
Saari et al.

[11] Patent Number: 5,727,306
[45] Date of Patent: Mar. 17, 1998

[54] DYNAMIC COMPONENT TRIMMING METHOD AND APPARATUS

[76] Inventors: David S. Saari, 20 Mayo Rd., Hubbardston, Mass. 01452; Kelli Kowaleski, 17 Norcross St., Apt. 2, Arlington, Mass. 02174

[21] Appl. No.: 698,250

[22] Filed: Aug. 12, 1996

Related U.S. Application Data

[63] Continuation of Ser. No. 393,529, Feb. 23, 1995, abandoned, which is a continuation of Ser. No. 890,516, May 28, 1992, abandoned.

[51] Int. Cl.$^6$ .............................. B23P 19/00; B23P 23/00; H05K 3/30
[52] U.S. Cl. .............................. 29/593; 29/592.1; 29/610.1; 29/832; 29/729; 29/740; 29/613; 29/564.7; 29/566.3
[58] Field of Search ............................ 29/620, 610.1, 29/593, 564, 564.1, 564.7, 564.8, 832–836, 740, 566.3, 729, 613; 219/121.68, 121.69

[56] References Cited

U.S. PATENT DOCUMENTS

| | | | |
|---|---|---|---|
| 3,699,649 | 10/1972 | McWilliams | 29/610.1 |
| 3,768,157 | 10/1973 | Buie | 29/620 |
| 3,827,142 | 8/1974 | Bennett et al. | 29/620 |
| 4,381,441 | 4/1983 | Desmarais | 219/121.69 |
| 4,450,619 | 5/1984 | Wright et al. | 29/33 M |
| 4,610,083 | 9/1986 | Campisi et al. | 29/832 |
| 4,825,536 | 5/1989 | Itemadani et al. | 29/836 |
| 4,907,341 | 3/1990 | Chapel, Jr. et al. | 29/610.1 |
| 5,003,153 | 3/1991 | Kondo | 219/121.69 |

*Primary Examiner*—P. W. Echols
*Attorney, Agent, or Firm*—Arthur W. Fisher; Ronald C. Hudgens

[57] ABSTRACT

Methods and apparatus for facilitating the use of existing onsertion machines by trimming and sequencing a plurality of components to be onsetted on an as-needed basis from components of generic values obtained from the manufacturer and providing the sequence of components to a single pick-up point on the onsertion machine. Post-encapsulation trimming of these components by laser also results in novel components of high precision.

9 Claims, 4 Drawing Sheets

DYNAMIC COMPONENT TRIMMING METHOD AND APPARATUS

This application is a continuation of application Ser. No. 08/393,529, now abandoned filed Feb. 23, 1995 which is a continuation of application Ser. No. 07/890,516, filed May 28, 1992, now abandoned.

FIELD OF THE INVENTION

This invention is generally related to the field of manufacturing of circuit boards. The invention provides means and apparatus for high-precision trimming of components such as surface mount resistors and capacitors for mounting on circuit boards, as well as the components so trimmed.

BACKGROUND OF THE INVENTION

Most electronic products manufactured today consist of printed wiring boards on which numerous electronic components are assembled. A method currently used to populate a printed wiring board (FR-4 or paper-based) is to "onsert" surface mount resistors and capacitors.

An alternative method of including resistors on a board is to screen the resistor pattern directly on the PWB and then trim the screened components to value while on the circuit board. This method is used primarily with materials more stable than FR-4. It also has the disadvantage that it is not field repairable. Thus, typically, it is used for encapsulated hybrid circuits.

In the "onsertion" approach, surface mount resistors and capacitors typically are trimmed to a final target value and then glass-encapsulated by a manufacturer prior to delivery to an assembler. A volume method for producing these components is to screen large ceramic substrates with a high number of resistors to standard sets of values with tolerances of 15%. When an order is received for a particular value of resistance (usually with a 5% or 1% tolerance), an appropriate standard value substrate is trimmed using a laser to the desired value. The trimmed resistors are then encapsulated, sliced into individual resistors, sorted to the appropriate tolerance range and packaged, for example, taped on 8 mm reels.

The onsertion process typically is performed by an automatic onsertion machine which has a traveling selector that sequentially, according to a computer program, selects components from a plurality of pick-up points (feeder locations), each supplied by a component reservoir (feeder bowl or tape) containing components of a particular "part number," with a particular value of electrical characteristic such as resistance or capacitance. The selector selects an individual component, and either the selector or a separate placing head onserts the individual component to a printed wiring board, one-by-one.

The component reservoirs and pick-up points typically are organized along the length of an onsertion machine and may number up to 200, limited by the length of the machine. For relatively complex electronic equipment such as computer circuit boards, a typical module line may require the stocking of on the order of 300–1,000 part numbers. In many cases, these part numbers are mostly surface mount resistors or capacitors. Each part number carries with it a significant overhead burden, such as set up time and jamming. Moreover, because this number usually exceeds the number of component reservoirs for presently used onsertion machines, multiple passes, with new set-ups, are required to populate the board, thereby adding to manufacturing time and to the opportunity for error and jamming.

SUMMARY OF THE INVENTION

The invention provides methods and apparatus for facilitating the use of existing onsertion machines by trimming and sequencing a plurality of components to be onsetted on an as-needed basis from components of generic values obtained from the manufacturer and providing the sequence of components to a single pick-up point on the onsertion machine. Post-encapsulation trimming of these components by laser also results in novel components of high precision.

Instead of allocating to each resistor (or capacitor) of a particular final value a pick-up point on an onsertion machine, the invention calls for the provision to the onsertion machine at a single pick-up point a sequence of resistors (or capacitors) of different values, trimmed from resistors (or capacitors) of a generic base value on an as-needed basis. The trimming and sequencing may be performed in advance for a particular set up or board by trimming the previously manufactured components and sequencing them on a standard tape for ordinary mounting in the onsertion machine for that pick-up point. Alternatively, the trimming and sequencing may be performed on an in-line, dynamic basis, that is, trimmed and positioned at the pick-up point one component at a time according to the immediate need.

The first, "trimmed-and-sequenced" alternative allows the trimming and sequencing to be performed off-line by a single apparatus for a plurality of onsertion machines and allows maximum speed at each onsertion machine. The second, "in-line dynamic" alternative allows components to be selected and trimmed to order, making possible immediate repairs.

Both alternatives have the advantage of using only a single onsertion machine pick-up point for a large plurality of resistor (or capacitor) values. This can reduce by several hundred the number of pick-up points required for the population of a complex board. In a typical case of roughly 400 part numbers, including 200 resistor values, this would make it possible to populate a board with one pass (and set up) of the onsertion machine, rather than two.

Even if two passes are not ordinarily required, the reduction of pick-up points dramatically reduces setup time. In an assembly with high component mixes, setup time on onsertion equipment often exceeds the run time. By eliminating multiple pick-up points for resistors, typically one-third to more than one-half of the components, set up time is almost proportionally reduced. (Setup for resistor trimming is done off-line in the "trimmed-and-sequenced" alternative and involves only approximately a dozen base resistor values in the "in-line, dynamic" alternative.)

The elimination of pick-up positions devoted to numerous resistor values not only saves the purchase cost of the mechanical parts related to the component reservoirs of the onsertion machine, but may improve the speed of population of a given board (at least in the case of the "trimmed-and-sequenced" alternative) by reducing the distance of travel to different part positions. The reduction of pick-up points also frees up component reservoirs for spares, which may avoid extended down times for the onsertion machine or allow fault-tolerant continued operation where one component reservoir is jammed.

The potential of the invention can be seen from an example where an assembly requires 638 surface mount resistor part numbers with values ranging from 10–4.7M ohms (a typical assembly may have 200–800 such part numbers). Not only can the invention eliminate all but one of the pick-up positions required on each pass of the assembly through the onsertion machine, but since all 638 surface mount resistor values can be trimmed from a subset of 12 base resistance values, the invention can reduce by 626 the number of part numbers to be purchased from a manufacturer and stocked at a board assembly facility for assembly or for repair.

The reduced inventory results in reduced material costs in a number of ways. First, untrimmed resistors are less expensive than trimmed resistors. Second, there may be economies of volume purchases of twelve base value untrimmed resistors. In addition, the invention has advantages of reduced material handling and management (thus cost), for example, in avoiding downtime ordinarily caused when the stock of a component of a particular value is either depleted ("short") or defective. Using the present invention, additional batches of untrimmed parts may be stocked for the roughly two dozen resistor or capacitor series or classes, rather than for each of hundreds of components with the final trimmed values.

The reduction of resistor (and capacitor) inputs also dramatically improves quality. Surface mount resistors (and capacitors) are tiny. Often an entire lot of modules is assembled with the wrong part value since no markings exist on the component. Since the input to the trimming and sequencing process of the present invention comprises only a dozen, rather than 200-800, surface mount resistors, the opportunity for error is greatly reduced.

In addition, as part of the invention, the trimming and sequencing is controlled by a computer program and the value of the component is measured as it is being trimmed. There is, in effect, 100% component verification. Especially in the "in-line, dynamic" alternative, there is a very small chance that the wrong value of trimmed component will be onsetted.

Using standard surface mount resistors and capacitors, glass-encapsulated by the manufacturer, as base value parts, implementation of the invention with laser trimming has additional advantages. As described in further detail below, the unique post-encapsulation laser trimming results in interaction between the laser and the glass that allows trimming to target values with a higher degree of precision, to within 0.1%.

The components trimmed, sequenced, and onserted according to this invention are field repairable, unlike components which are directly screened and trimmed on the PWB. The method of the invention also requires no additional process steps such as the screening and curing required by the screening approach.

BRIEF DESCRIPTION OF THE DRAWINGS

In order that the invention may be more clearly understood, reference is made to the accompanying drawings which show an illustrative embodiment and details of its operation.

DETAILED DESCRIPTION OF AN ILLUSTRATIVE EMBODIMENT

Figure 1:
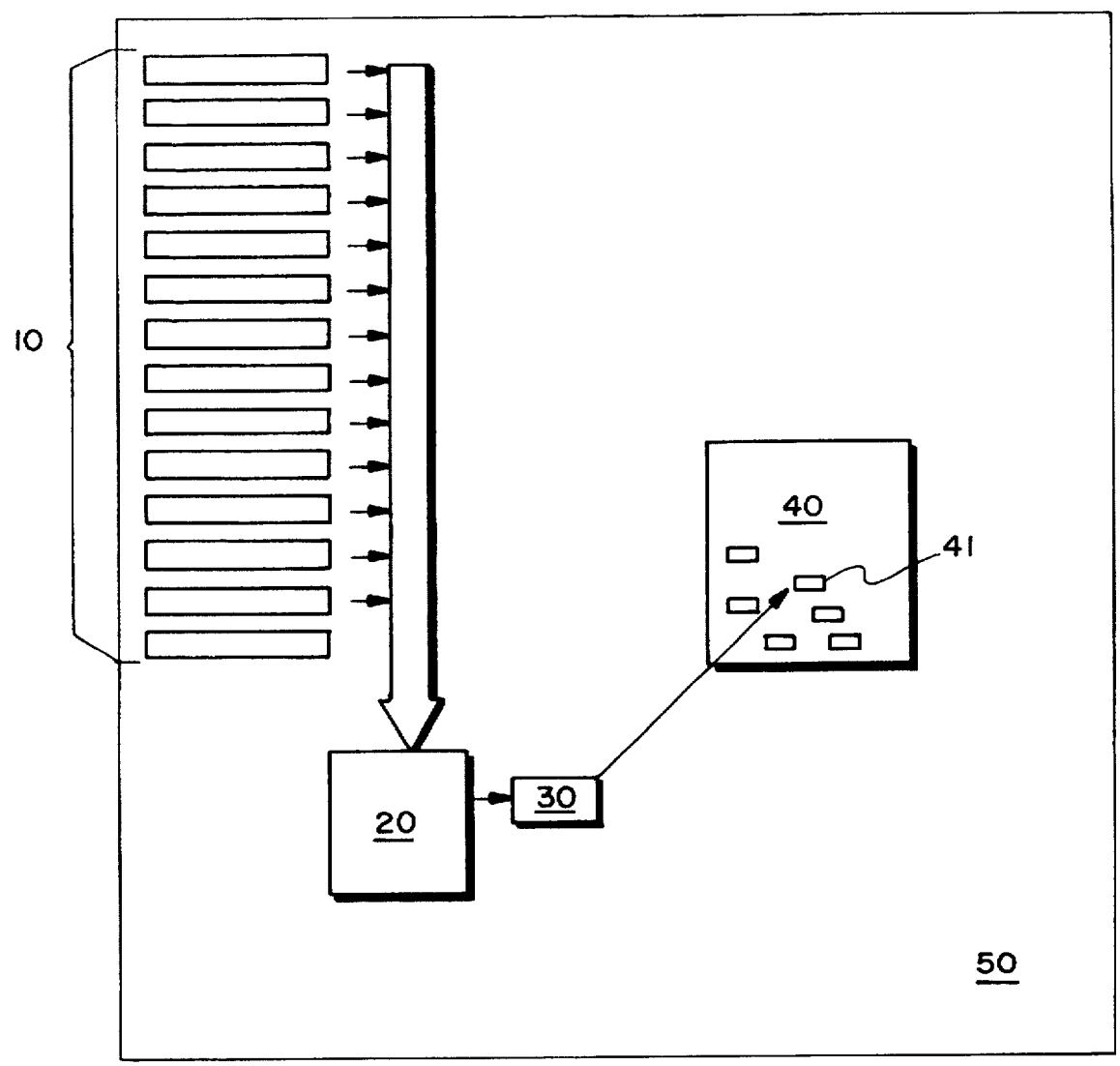
FIG. 1 shows the dynamic in-line trim embodiment of the invention.
Figure 3:
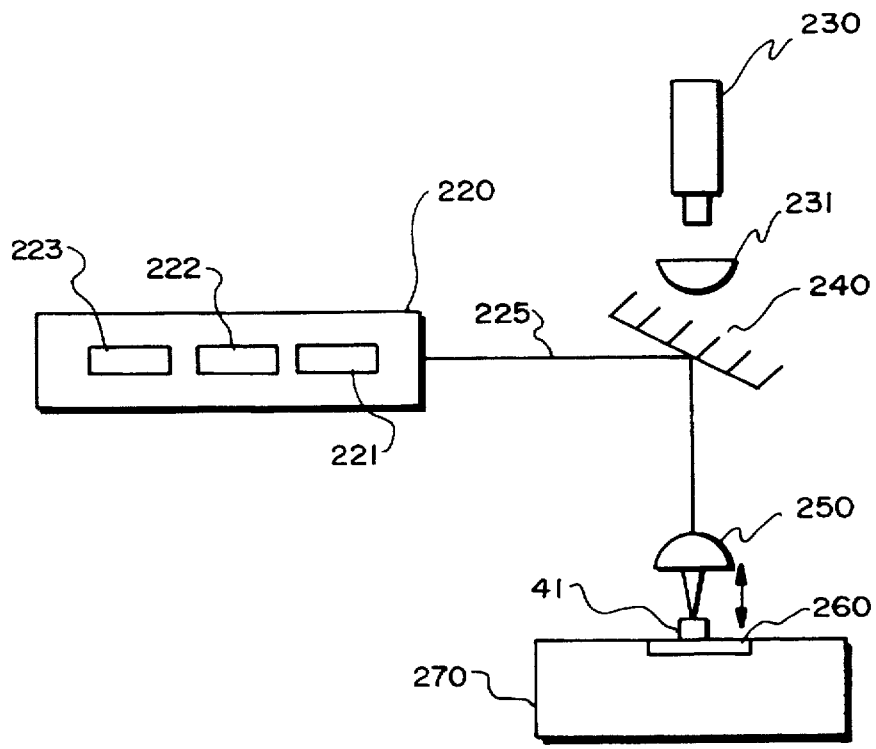
FIG. 3 shows a laser trimming set up used in the invention.

FIG. 1 shows an onsertion machine 50 including the dynamic in-line trim mechanism shown as feeders 10 and trim station 20. Base or "blank", untrimmed, components are placed in the feeders 10 according to their values. For example, there may be thirteen feeders each containing blank surface mount resistors of one base value. A laser implementation of the trim station 20 is shown in FIG. 3, which will be explained further below. After trimming to value, the trimmed component is placed in (fed to) the pick-up point 30 and is placed on the PWB 40 at location 41 according to the ordinary onsertion process.

Figure 2:
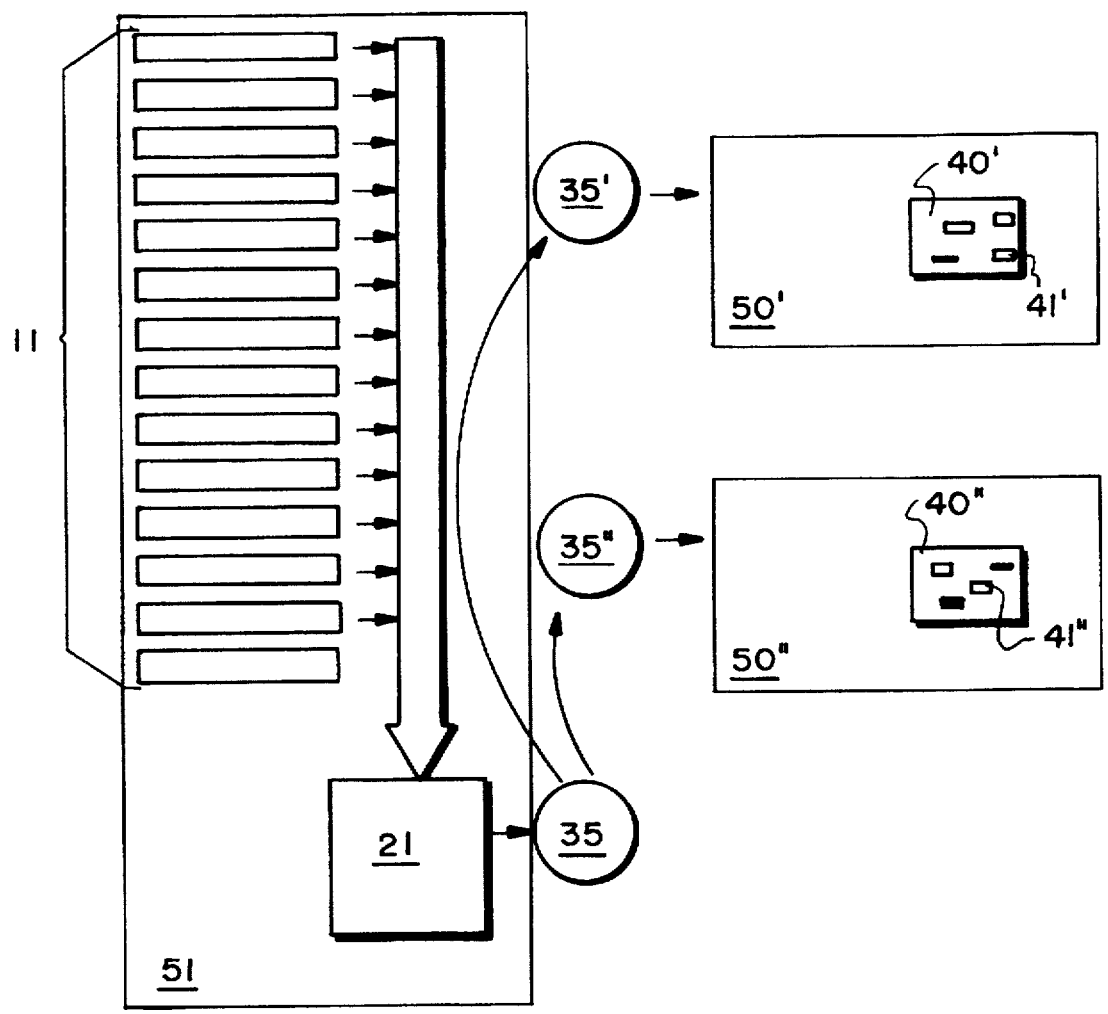
FIG. 2 shows the trimmed-and-sequenced embodiment of the invention.

FIG. 2 shows a trimming machine 51 according to the trimmed-and-sequenced alternative of the invention, with feeders 11 and trim station 21. As in the dynamic in-line alternative, untrimmed components are placed in the feeders 11 according to their values. Again, a laser implementation of the trim station 21 is shown in FIG. 3. After trimming to fine value, however, the trimmed component is placed in sequence and placed in a tape in part taper 35. These resulting tape reels, shown as 35' and 35", may be fed respectively to different onsertion machines 50' and 50" for onsertion of the parts contained on the reels on PWBs 40' and 40" at locations exemplified by 41' and 42".

Figure 5:
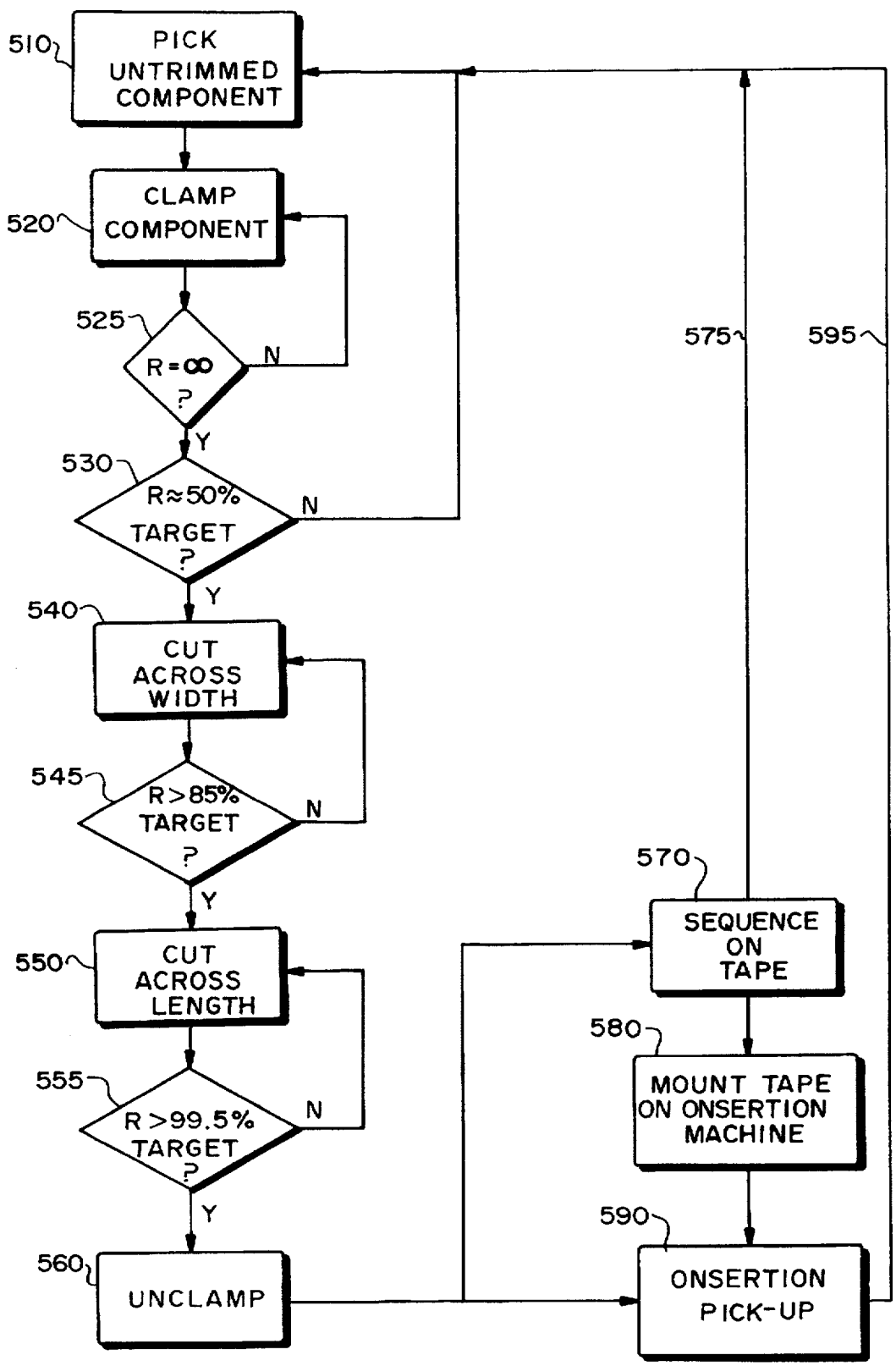
FIG. 5 is a process flow chart showing both the dynamic in-line trim and trimmed-and-sequenced embodiments of the invention.

These processes are further described referring respectively to FIGS. 1 and 2, and to FIG. 5, which shows a process flow chart. In each process, onsertion information is first acquired describing the sequence (onsertion order), the location (X-Y-rotation-side) and values of all the resistors used on the PWB 40 (FIG. 1), 40' or 40" (FIG. 2).

The computer software selects a particular feeder among feeders 10 (FIG. 1) or 11 (FIG. 2) to deliver a component to the respective trim/test nest 20 or 21 by comparing the target resistance to the values loaded in the feeders.

The resistor is picked from a feeder 510 (FIG. 5) and delivered into the trim/test nest where it is clamped 520 on a ceramic fixture 260 (FIG. 3) transparent to the laser, and test probes (not shown) are engaged.

An initial resistance measurement is made to ensure that both the test probes have contact and that the untrimmed value is within accepted tolerance. If the resistance tested at 525 is infinite, redamping 520 is attempted (note that this may be a once only loop). If the resistance tested at 530 is not within an accepted range, for example, 15%, of an appropriate starting value, for example, 50% of the target value of the trimmed component, the component 41 is rejected and another part is fed 510.

FIG. 3 shows a laser trimming set up, using laser assembly 220. The laser 222 may be a yttrium aluminum garnet (YAG) laser with a wavelength of 1064 nm in the near infrared range (the encapsulation glass is transparent at this frequency) of about 20 watts power; a neodynmium-YAG laser has been used. The laser output is controlled by Q-switch 223 (which may be an acousto-optical modulator) and mechanical shutter 221, and is directed by mirror 240 through objective lens 250 (which may be 50 mm) at the component 41, damped on the fixture 260. A camera 230 and lens 231 are provided to observe the trimming process. The laser beam may be positioned by moving the mirror 240 or the stage or x-y table 270. The discussion here assumes that the beam is moved by the deflection of the mirror.

Figure 4:
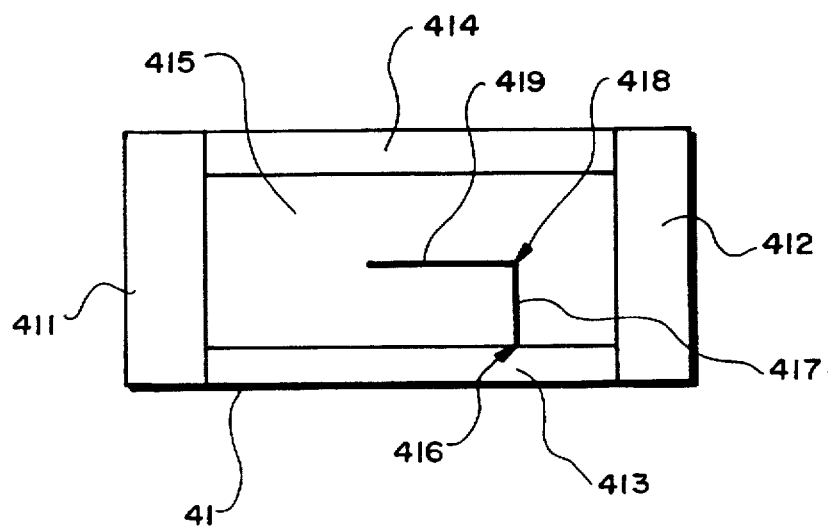
FIG. 4 shows a surface mount resistor trimmed using the invention.

The trimming is commenced by positioning the laser beam to a start trim point 416 (FIG. 4) nearer one lead 412 than a second lead 411 of the substantially rectangular component 41. The laser shutter 221 is opened, the Q-switch 223 is enabled, and the laser beam deflection starts across the width of the component 417 (540 in FIG. 5). A laser power level of about 2 watts may be used, with a Q-switch frequency of 6 KHz, a scan speed of 0.2 inches/second, and a beam size of 1–2 mils. No cutting occurs until the actual resist material 415 is encountered. The glass encapsulant (not shown) and the ceramic substrate (shown as 413 and 414) do not absorb enough energy to be cut by the laser beam.

When the resistive material 415 is encountered, it absorbs the energy of the laser and cutting begins. The glass encapsulant does not directly absorb the laser beam energy. However, it is heated by the cutting of the resist. As the beam traverses across the component, the glass reflows over the cut and rapidly cools. This unanticipated side effect tends to stabilize the component and prevents conductive particles from shifting in position. This gives the component more stability than conventional components in which glass encapsulation is performed after trimming and may leave loose conductive particles within pockets left by the glass encapsulant. The technique of the current invention provides precision within 0.1% with high reliability and could easily be applied to conventional processes for surface mount resistors and achieve the same quality levels.

As the laser beam cuts across the width of the resist 415 along line 417, the current path between leads 411 and 412 is reduced in width and the resistance of the component is increased. This increasing resistance is monitored by reading the voltage in a test circuit (not shown) connected in step 520 and is continuously fed back to the computer through an analog-to-digital converter (not shown).

The resistance is tested 545 (FIG. 5), and when it reaches 85% of the target value (leaving about 50% of the current path intact across the resistor), the motion across the component is stopped at 418 (FIG. 4) and the beam is directed lengthwise 419 on the resist toward the farther lead 411 of the component. This lengthwise cut in the direction of current path also increases resistance, but at a lesser rate of increase in resistance per distance traveled by the laser beam.

The resistance is tested 555 (FIG. 5), and when it reaches a desired range, for example, 99.5%, of the target resistance, the Q-switch 223 is turned off and the shutter 221 is closed. The Q-itch is preferred to the mechanical shutter, providing more precisely valued components. Starting with 13 untrimmed resistor types and trimming to increase up to 100% over the untrimmed values, resistors in the range 30–150K ohms have been trimmed in this process, accounting for some 73% of the surface mount resistors generally used.

After trimming, the part 41 is undamped 560, picked from the trim/test nest and placed either on the printed wiring board at the desired pick point 30 (FIG. 1, in-line method) or, through a taper 35 (FIG. 2) in the pocket of an 8 mm tape reel, for example reel 35' or 35" (sequencing method).

At this point, the two alternatives diverge. In the in-line alternative (FIG. 1), the part 41 is picked up 590 and placed on PWB 40 by the onsertion machine 50 in the ordinary way. The cycle is repeated 595 according to the onsertion order for a particular PWB, or, since it is an in-line process, according to a repair order.

In the trimmed-and-sequenced approach, the component 41 is sequenced 570 using a taper 35, and the cycle is repeated 575 for all the resistors in the onsertion order that are to be trimmed from untrimmed components. An empty pocket (gap) may be left between sequences to provide synchronization with the assembly equipment. The end result of the trimmer 51 is to produce tapes such as 35' and 35". These tapes may be mounted 580 on different onsertion machines 50' and 50" to respectively populate PWBs 40' and 40" with respective trimmed components 41' and 40". An advantage of the trimmed-and-sequenced approach is that the trimming and sequencing are done off-line and provide a sequence for onsertion at maximum speed.

As readily apparent, other implementations of the above illustrative embodiments are possible for exploiting the invention. For example, the components need not be resistors and need not be rectangular in configuration. Other methods for maintaining a sequence may be possible in the trimmed-and-sequenced approach.

Having described this invention, what is claimed as new and secured by Letters Patent are:

1. A method for operating an automated assembler of electronic components selected from components placed at a plurality of pick up locations, said method comprising, in substantively immediate succession:

A) selecting from a plurality of input component locations on said automated assembler a glass encapsulated component having a preselected general value of an electrical characteristic that is suitable for trimming to a selected one of a plurality of different precise values of said electrical characteristic, said selected one precise value being predetermined by a value required for a next electronic component placement location on a printed wiring board;

B) trimming said component to said precise value of said electrical characteristic by applying a laser beam through the glass encapsulation;

C) measuring said electrical characteristic of the component during said trimming step and using results of said measuring step to control the said trimming step;

D) placing said component at one of said plurality of pick up locations;

E) picking up said component and assembling it according to the ordinary operation of said automated assembler; and F) repeating steps (A) through (E) substantially immediately for other components and for other ones of said different precise values over a plurality of cycles.

2. A method for operating an automated assembler of electronic components selected from components provided to it on a plurality of vehicles, said method comprising:

A) selecting a component of an approximate value of an electrical characteristic and suitable for trimming to a plurality of precise values of said electrical characteristic;

B) trimming said component to one of said plurality of precise values of said electrical characteristic;

C) temporarily fixing said component on a vehicle;

D) repeating steps (A) through (C) substantially immediately for other components and for other precise values over a plurality of cycles where the components are sequenced on said vehicle according to the sequence of trimming; and E) providing said vehicle to said automated assembler for assembling the components thereon according to the ordinary operation of said automated assembler.

3. The method of claim 2 wherein said vehicle and said plurality of vehicles are tapes.

4. The method of claim 2 wherein the component of step (A) is encapsulated in glass and the trimming of step (B) is performed by applying a laser beam through the glass encapsulation.

5. The method of claim 2 wherein the electrical characteristic of the component trimmed in step (B) is measured as it is being trimmed and the results of said measurement are used to control the extent of said trimming.

6. An apparatus for supplying electronic components to an automated assembler of electronic components selected from components placed at a plurality of pick up locations, said apparatus comprising:

A) at least one reservoir for glass encapsulated components of a preselected general value of an electrical characteristic and suitable for trimming to a selected one of a plurality of different precise values of said electrical characteristic, said selected one precise value being predetermined by a value required for a next electronic component placement location on a printed wiring board;

B) means for selecting a component held in said at least one reservoir;

C) laser means for trimming said component through the glass encapsulation to said selected one precise value of said electrical characteristic, said laser means further including:
  (I) means for measuring the electrical characteristic of the component as it is being trimmed and providing a measurement output; and
  (ii) means responsive to said measurement output for controlling the extent of trimming;

D) means for placing said component at one of said plurality of pick up locations; and E) means for engaging the selecting, trimming and placing means in substantially immediate succession according to a required sequence of components of given precise values of said electrical characteristic.

7. An apparatus for supplying an automated assembler of electronic components selected from components provided to it on a plurality of vehicles, said apparatus comprising:

A) at least one reservoir for components of a preselected general value of an electrical characteristic and suitable for trimming to a plurality of distinct precise values of said electrical characteristic;

B) means for selecting a component held in said reservoir;

C) means for trimming said component to one of said plurality of distinct precise values of said electrical characteristic, said means for trimming further comprising;
  (I) means for measuring the electrical characteristic of the component as it is being trimmed and providing a measurement output; and
  (ii) means responsive to said measurement output for controlling the extent of trimming;

D) means for temporarily fixing said component on a vehicle; and

E) means for engaging said means for selecting, trimming and fixing in substantially immediate succession according to a required sequence of components of given precise values of said electrical characteristic.

8. The apparatus of claim 7 wherein said vehicle and said plurality of vehicles are tapes.

9. The apparatus of claim 7 wherein the component of selected by the selecting means is encapsulated in glass and the means for trimming comprises a laser.

* * * * *